US012713930B2

(12) United States Patent
Yang et al.

(10) Patent No.: US 12,713,930 B2
(45) Date of Patent: Aug. 18, 2026

(54) CHIP PACKAGE WITH HEAT DISSIPATION PLATE AND MANUFACTURING METHOD THEREOF

(71) Applicant: STATS ChipPAC Semiconductor (Jiangyin) Co., LTD., Wuxi City (CN)

(72) Inventors: Shuai Yang, Wuxi City (CN); Hongde Dai, Wuxi City (CN); Jian Xu, Wuxi City (CN)

(73) Assignee: STATS CHIPPAC SEMICONDUCTOR (JIANGYIN) CO., LTD., Wuxi City (CN)

( * ) Notice: Subject to any disclaimer, the term of this patent is extended or adjusted under 35 U.S.C. 154(b) by 454 days.

(21) Appl. No.: 18/213,943

(22) Filed: Jun. 26, 2023

(65) Prior Publication Data

US 2024/0006339 A1 Jan. 4, 2024

(30) Foreign Application Priority Data

Jun. 29, 2022 (CN) ......................... 202210760770.0

(51) Int. Cl.
*H10W 42/20* (2026.01)
*H10W 40/22* (2026.01)
(Continued)

(52) U.S. Cl.
CPC ........... *H10W 42/20* (2026.01); *H10W 40/22* (2026.01); *H10W 72/227* (2026.01); *H10W 74/012* (2026.01); *H10W 74/15* (2026.01); *H10W 70/685* (2026.01); *H10W 72/072* (2026.01); *H10W 72/073* (2026.01);
(Continued)

(58) Field of Classification Search
None
See application file for complete search history.

(56) References Cited

U.S. PATENT DOCUMENTS 9,812,374 B1 * 11/2017 Refai-Ahmed ....... H10W 40/22
2008/0054450 A1 * 3/2008 Chiu ..................... H10W 40/22
257/E23.102

(Continued)

FOREIGN PATENT DOCUMENTS

CN 106129025 A 11/2016
CN 111668173 A 9/2020

*Primary Examiner* — Dale E Page
*Assistant Examiner* — Rohit Parthasarathy
(74) *Attorney, Agent, or Firm* — MUNCY, GEISSLER, OLDS & LOWE, P.C.

(57) ABSTRACT

The present invention provides a chip packaging structure having a heat dissipation plate and a manufacturing method thereof. The packaging structure includes a substrate, at least one chip, the heat dissipation plate, a plastic packaging layer and a metal shielding layer, wherein the heat dissipation plate is bonded to a first surface of the substrate, a thermal interface material is filled between the heat dissipation plate and the chip, the heat dissipation plate is connected to the first surface, and a connection strength between the conductive connector and the substrate and the heat dissipation plate is greater than a connection strength between the thermal interface material and the chip and the heat dissipation plate; the plastic packaging layer exposes at least part of a surface region of the heat dissipation plate; and the metal shielding layer is at least connected to the surface region.

7 Claims, 5 Drawing Sheets

(51) Int. Cl.

| | |
|---|---|
| ***H10W 70/685*** | (2026.01) |
| ***H10W 72/00*** | (2026.01) |
| ***H10W 72/20*** | (2026.01) |
| ***H10W 72/30*** | (2026.01) |
| ***H10W 74/01*** | (2026.01) |
| ***H10W 74/15*** | (2026.01) |
| ***H10W 90/00*** | (2026.01) |
| ***H10W 99/00*** | (2026.01) |

(52) U.S. Cl.

CPC .... *H10W 72/07354* (2026.01); *H10W 72/222* (2026.01); *H10W 72/241* (2026.01); *H10W 72/248* (2026.01); *H10W 72/325* (2026.01); *H10W 72/347* (2026.01); *H10W 72/352* (2026.01); *H10W 72/354* (2026.01); *H10W 72/877* (2026.01); *H10W 90/701* (2026.01); *H10W 90/724* (2026.01); *H10W 90/726* (2026.01); *H10W 90/734* (2026.01); *H10W 90/736* (2026.01); *H10W 99/00* (2026.01)

(56) References Cited

U.S. PATENT DOCUMENTS

| | | | | |
|---|---|---|---|---|
| 2011/0316035 | A1 * | 12/2011 | Shin | H05K 3/0061 257/E33.056 |
| 2013/0277821 | A1 * | 10/2013 | Lundberg | H10W 40/00 257/713 |
| 2014/0151871 | A1 * | 6/2014 | Refai-Ahmed | H10W 40/611 165/185 |
| 2016/0329261 | A1 * | 11/2016 | Hung | H10W 40/22 |
| 2020/0058571 | A1 * | 2/2020 | Wang | H10W 40/037 |
| 2020/0219789 | A1 * | 7/2020 | Uppal | H10W 40/73 |
| 2020/0286839 | A1 * | 9/2020 | Jang | H10W 40/22 |
| 2021/0159139 | A1 * | 5/2021 | Yu | H10W 40/10 |
| 2021/0193620 | A1 * | 6/2021 | Refai-Ahmed | H10W 40/228 |
| 2021/0249328 | A1 * | 8/2021 | Refai-Ahmed | H10W 40/226 |
| 2021/0305127 | A1 * | 9/2021 | Refai-Ahmed | H10W 40/47 |
| 2023/0207422 | A1 * | 6/2023 | Refai-Ahmed | H10W 40/73 257/704 |
| 2023/0282547 | A1 * | 9/2023 | Refai-Ahmed | H10W 40/73 257/715 |
| 2023/0420335 | A1 * | 12/2023 | Refai-Ahmed | H10W 40/22 |
| 2024/0006339 | A1 * | 1/2024 | Yang | H10W 42/20 |
| 2024/0006370 | A1 * | 1/2024 | Yu | H10W 40/70 |
| 2024/0314919 | A1 * | 9/2024 | Artman | H05K 1/0206 |
| 2024/0404930 | A1 * | 12/2024 | Liao | H10W 74/00 |

* cited by examiner

S1: Providing a chip, and disposing at least one chip-side metal block on a non-functional surface of the chip S2: Providing a heat-radiating cover plate, and disposing at least one cover plate-side metal block on an inner surface of a top cover plate of the heat-radiating cover plate S3: Providing a substrate, disposing a functional surface of the chip towards a first surface of the substrate, and electrically connecting the functional surface of the chip and the first surface of the substrate S4: Coating the inner surface of the top cover plate of the heat-radiating cover plate with a thermal interface material S5: Bonding the heat-radiating cover plate to the substrate, and fusion-bonding the cover plate-side metal block and the chip-side metal block S6: Plastic-packaging the chip, the substrate and the heat-radiating cover plate, and exposing at least part of a surface of the heat-radiating cover plate S7: Forming a metal shielding layer by sputtering on a surface of a plastic packaging layer

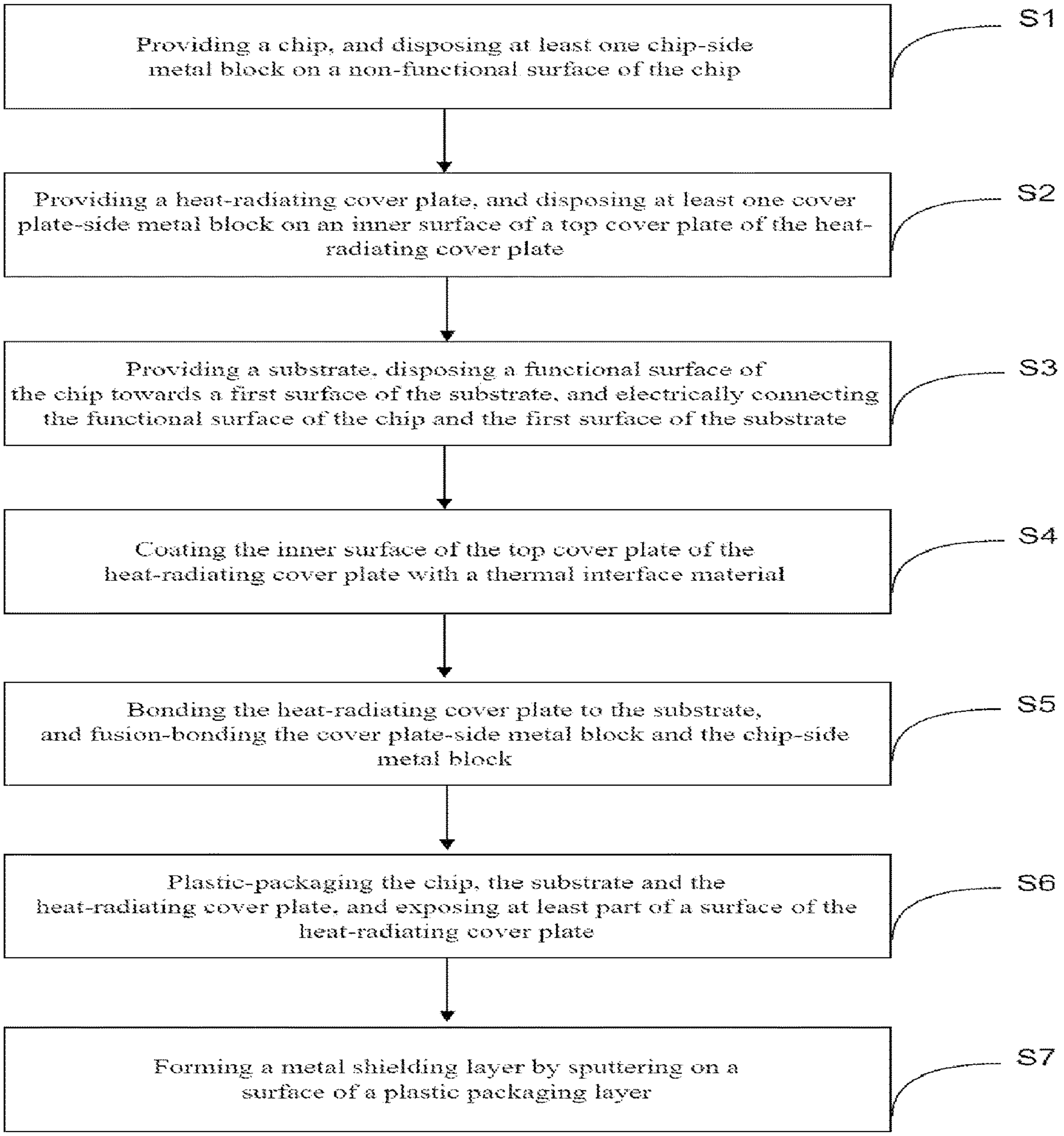

FIG. 3

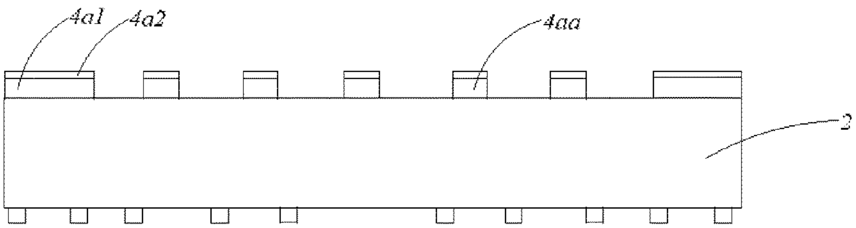

FIG. 4

CHIP PACKAGE WITH HEAT DISSIPATION PLATE AND MANUFACTURING METHOD THEREOF

TECHNICAL FIELD

The present invention relates to the field of electronic packaging technologies, and in particular to a chip packaging structure having a heat dissipation plate and a manufacturing method thereof.

BACKGROUND

Various digital and high-frequency electronic components radiate a large number of electromagnetic waves at different frequencies and wavelengths to the space during operation, and electromagnetic radiation and electromagnetic waves may severely interfere with the realization of performance of the electronic components. With the development of electronic and communication technologies, requirements for electromagnetic shielding devices in electronic packaging of chips increase continuously, and requirements for electromagnetic shielding also become higher and higher.

FIG. 1 illustrates a chip packaging structure having a heat dissipation plate in an existing technical solution. The chip packaging structure includes a substrate 1' and a metal shielding layer 8'. The substrate 1' has a first surface 1*a*' and a second surface 1*b*' opposite to each other, and a grounding pin 13' and a solder ball 12' are disposed on the second surface 1*b*' of the substrate. Generally, the metal shielding layer 8' is formed by sputtering a surface of the packaging structure, and extends to the second surface 1*b*' of the substrate to be connected to the grounding pin 13'. However, the metal shielding layer 8' with such structure is prone to over-plating, thereby contaminating the solder ball 12', or resulting in a failure of grounding connection due to a non-uniform thickness of a plating layer.

SUMMARY

An object of the present invention is to provide a chip packaging structure having a heat dissipation plate and a manufacturing method thereof.

The present invention provides a chip packaging structure having a heat dissipation plate. The chip packaging stricture includes:

- a substrate having a first surface and a second surface opposite to each other, wherein the first surface of the substrate is provided with a grounding pin;
- at least one chip disposed on the first surface of the substrate and electrically connected to the substrate;
- the heat dissipation plate, wherein the heat dissipation plate is a metal cover plate that is bonded to the first surface of the substrate, the heat dissipation plate and the substrate form a cavity in a surrounding manner for holding the chip therein, a thermal interface material is filled between the heat dissipation plate and the chip, the heat dissipation plate is connected to the first surface of the substrate through a conductive connector and electrically connected to the grounding pin, and a connection strength between the conductive connector and the substrate and the heat dissipation plate is greater than a connection strength between the thermal interface material and the chip and the heat dissipation plate;
- a plastic packaging layer covering the chip, the substrate and the heat dissipation plate and exposing at least part of a surface region of the heat dissipation plate; and
- a metal shielding layer disposed on a surface of the plastic packaging layer and at least connected to the surface region of the heat dissipation plate exposed by the plastic packaging layer, and electrically connected to the grounding pin through the heat dissipation plate and the conductive connector.

As a further improvement of the present invention, the heat dissipation plate and the chip are connected by at least one fixed connector, and a connection strength between the fixed connector and the chip or the heat dissipation plate is greater than the connection strength between the thermal interface material and the chip or the heat dissipation plate.

As a further improvement of the present invention, the heat dissipation plate and the chip are connected by a plurality of fixed connectors, and the fixed connectors are at least distributed at an edge of a non-functional surface of the chip.

As a further improvement of the present invention, the fixed connectors at least include first fixed connectors and second fixed connectors, a connection strength between the first fixed connectors and the chip or the heat dissipation plate is greater than a connection strength between the second fixed connectors and the chip or the heat dissipation plate, the first fixed connectors are distributed at four corners and/or four sides of the non-functional surface of the chip, and the second fixed connectors are distributed in a region between the first fixed connectors on two opposite sides.

As a further improvement of the present invention, the area of a fixed connection region between the first fixed connectors and the chip or the heat dissipation plate is larger than the area of a fixed connection region between the second fixed connectors and the chip or the heat dissipation plate.

As a further improvement of the present invention, the fixed connector is a bonded metal block disposed between the chip and the heat dissipation plate, and the conductive connector is a bonded metal block disposed between the substrate and the heat dissipation plate.

As a further improvement of the present invention, the chip has a functional surface towards the first surface of the substrate and a non-functional surface opposite to the functional surface, and at least one chip-side metal block is disposed on the non-functional surface of the chip.

As a further improvement of the present invention, the heat dissipation plate includes a top cover plate and a side cover plate extending downward along an edge of the top cover plate, the top cover plate is bonded above the non-functional surface of the chip, a tail end of the side cover plate is connected to the first surface of the substrate through the conductive connector, at least one cover plate-side metal block is disposed on an inner surface of the top cover plate, the position and the number of the at least one cover plate-side metal block are set corresponding to those of the at least one chip-side metal block, and the cover plate-side metal block and the chip-side metal block are bonded to form the bonded metal block.

As a further improvement of the present invention, the plastic packaging layer completely exposes an outer surface of the top cover plate of the heat dissipation plate, and the metal shielding layer completely covers the plastic packaging layer and the outer surface of the top cover plate.

As a further improvement of the present invention, a tail end of the metal shielding layer is disposed outside an edge of the substrate.

The present invention further provides a manufacturing method of a chip packaging structure having a heat dissipation plate. The manufacturing method thereof includes the following steps of:

providing a chip;

providing a metal heat dissipation plate, and disposing a metal block on a surface where a tail end of the heat dissipation plate is in contact with the substrate;

providing a substrate, disposing a functional surface of the chip toward a first surface of the substrate, electrically connecting the functional surface of the chip and the first surface of the substrate, and disposing a metal block at a position where the substrate is connected to the heat dissipation plate;

coating an inner surface of a top cover plate of the heat dissipation plate with a thermal interface material;

bonding the heat dissipation plate to the substrate, and fusion-bonding the metal blocks on the substrate and the heat dissipation plate;

plastic-packaging the chip, the substrate and the heat dissipation plate, and exposing at least part of a surface of the heat dissipation plate; and forming a metal shielding layer by sputtering on a surface of a plastic packaging layer.

As a further improvement of the present invention, plastic-packaging the chip, the substrate and the heat dissipation plate, and exposing at least part of the surface of the heat dissipation plate specifically includes:

plastic-packaging the chip, the substrate and the heat dissipation plate, and completely exposing an outer surface of the top cover plate of the heat dissipation plate.

As a further improvement of the present invention, providing the chip further includes:

disposing at least one chip-side metal block on a non-functional surface of the chip.

As a further improvement of the present invention, providing the metal heat dissipation plate further includes:

disposing at least one cover plate-side metal block on the inner surface of the top cover plate of the heat dissipation plate.

As a further improvement of the present invention, disposing at least one chip-side metal block on the non-functional surface of the chip specifically includes:

disposing a plurality of chip-side metal blocks on the non-functional surface of the chip, and at least disposing the chip-side metal blocks at an edge of the non-functional surface of the chip.

As a further improvement of the present invention, disposing at least one chip-side metal block on the non-functional surface of the chip further includes:

disposing first chip-side metal blocks at four corners and/or four sides of the non-functional surface of the chip, and disposing second chip-side metal blocks in a region between the first chip-side metal blocks on two opposite sides, wherein the area of a fixed connection region between the first chip-side metal blocks and the chip is larger than the area of a fixed connection region between the second chip-side metal blocks and the chip.

As a further improvement of the present invention, disposing at least one cover plate-side metal block on the inner surface of the top cover plate of the heat dissipation plate specifically includes:

disposing the heat dissipation plate-side metal blocks with the same number as the chip-side metal blocks on the inner surface of the top cover plate of the heat dissipation plate and at the positions corresponding to the chip-side metal blocks.

The present invention has the following beneficial effects. In the present invention, since the metal heat dissipation plate is connected to the grounding pin on the first surface of the substrate through the conductive connector, the metal shielding layer disposed on the surface of the plastic packaging layer can be directly and electrically conducted with the grounding pin through the heat dissipation plate and the conductive connector, such that the metal shielding layer does not need a structure in the existing technical solution which requires the metal shielding layer to extend to the second surface so as to be connected to the grounding pin Thus, the metal shielding layer will not contaminate a solder ball on the surface of the substrate. Further, the metal shielding layer which is in large-area contact with the top cover plate of the heat dissipation plate is protected from grounding conduction failure arising from a crack, thereby increasing the product yield of the packaging structure and improving the reliability. In addition, the conductive connector with the connection strength higher than that of the thermal interface material is disposed between the heat dissipation plate and the substrate, thereby increasing the connection strength between the substrate and the heat dissipation plate, and reducing the warpage and deformation among the substrate, the chip and the heat dissipation plate.

BRIEF DESCRIPTION OF THE DRAWINGS

FIG. 3 is a schematic flowchart of a manufacturing method of a chip packaging structure having a heat dissipation plate according to an embodiment of the present invention; and FIG. 4 to FIG. 10 are schematic diagrams of steps of a manufacturing method of a chip packaging structure having a heat dissipation plate according to an embodiment of the present invention.

DETAILED DESCRIPTION

Figure 1:
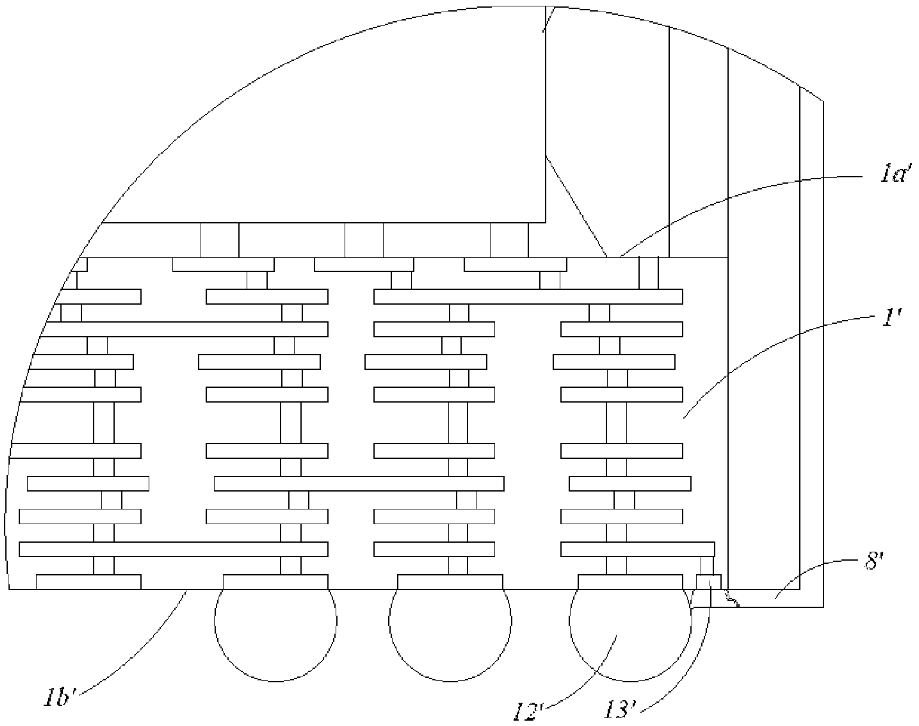
FIG. 1 is a schematic structural diagram of a chip packaging structure having a heat dissipation plate in an existing technical solution.

In order to make the objects, technical solutions, and advantages of the present application clearer, the technical solutions of the present application will be clearly and completely described below in conjunction with the specific embodiments of the present application and the corresponding accompanying drawings, Obviously, the described embodiments are only a part of the embodiments of the present application, rather than all of the embodiments. Based on the embodiments in present application, all other embodiments obtained by those of ordinary skill in the art without creative work shall fall within the protection scope of the present application.

The following describes the embodiments of the present invention in detail, Examples of the embodiments are shown in the accompanying drawings, in which the same or similar reference numerals indicate the same or similar elements or elements with the same or similar functions throughout the Description. The following embodiments described with reference to the accompanying drawings are exemplary and only used to explain the present invention, but should not be understood as limiting the same.

For the convenience of description, the terms representing relative positions in space, such as "upper", "lower", "rear" and "front" are used herein for description, and intended to describe a relationship of one unit or feature shown in the drawings relative to another unit or feature. The terms representing the relative positions in space may include different orientations of a device in use or operation other than the orientations shown in the drawings. For example, if an apparatus in the drawings is turned over, the unit described as being "below" or "above" another unit or feature will be positioned "above" or "below" the other units or features. Therefore, the exemplary term "below" can encompass both spatial orientations of "below" and "above".

Figure 2:
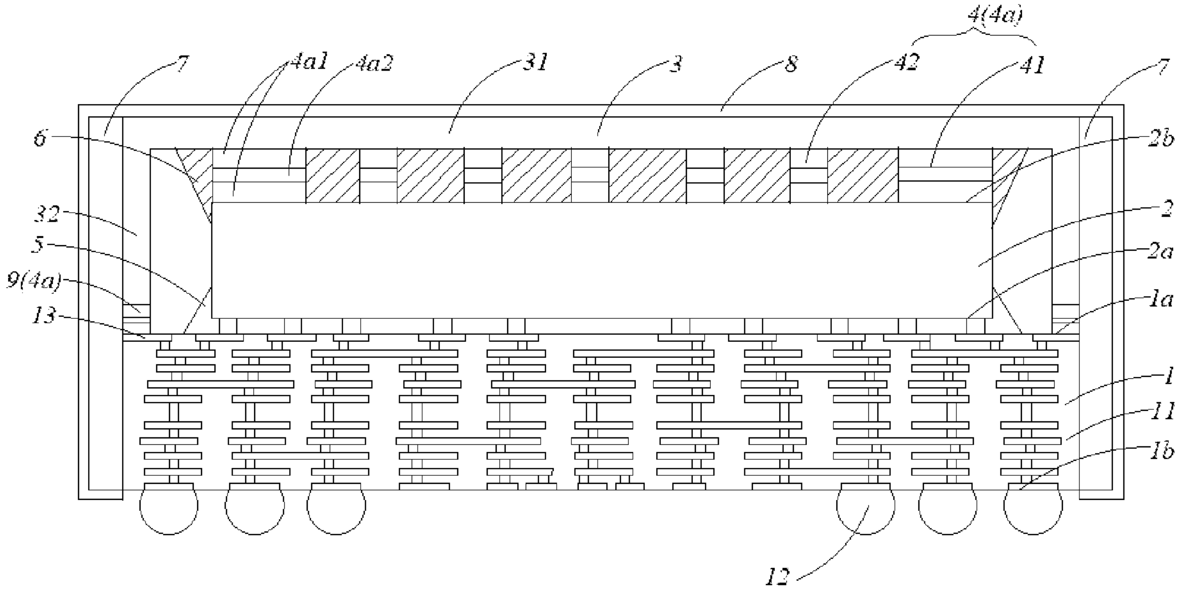
FIG. 2 is a schematic structural diagram of a chip packaging structure having a heat dissipation plate according to an embodiment of the present invention.

As shown in FIG. 2, a chip packaging structure having a heat dissipation plate is provided according to an embodiment. The chip packaging structure includes: a substrate 1, at least one chip 2, a heat dissipation plate 3, a plastic packaging layer 7 and a metal shielding layer 8. The metal shielding layer 8 is grounded through the heat dissipation plate 3, avoiding contamination of a solder ball 12. Further, the heat dissipation plate 3 is connected to the chip 2 and the substrate 1 through a fixed connector 4 respectively. Compared with a direct connection through a thermal interface material 6, the connection through the fixed connector 4 increases a bonding force among the heat dissipation plate 3, the chip 2 and the substrate 1, restrains the warpage and deformation between the chip 2 and the heat dissipation plate 3, and reduces a risk of delamination of the thermal interface material 6.

The substrate 1 has a first surface 1*a* and a second surface 1*b* opposite to each other, and the first surface 1*a* of the substrate is provided with a grounding pin 13. In this embodiment, a bonding pad for forming an electrical connection with the chip 2 is disposed on the first surface 1*a* of the substrate, and a conductive connection structure such as the solder ball 12 for forming an electrical connection with an externally-connected circuit or other chips 2 is disposed on the second surface 1*b* of the substrate; and at least one metal wiring layer 11 is disposed inside the substrate 1, and the bonding pad, the grounding pin 13 and the solder ball 12 are electrically communicated through the metal wiring layer 11.

At least one chip 2 is disposed on the first surface 1*a* of the substrate and electrically connected to the substrate 1. In this embodiment, one chip 2 is disposed on the substrate 1, and the chip 2 has a functional surface 2*a* and a non-functional surface 2*b* opposite to each other. The functional surface 2*a* of the chip is provided with a conductive connection structure such as the solder ball, faces the first surface 1*a* of the substrate, and is flip-mounted on and electrically connected to the substrate 1. An underfill 5 is filled between the chip 2 and the substrate 1 to reduce stress between the substrate 1 and the chip 2 resulted from the mismatch of thermal expansion coefficients and to further protect the solder ball of the chip 2 and the surface of the substrate 1.

In other embodiments of the present invention, a plurality of chips 2 and other passive electronic components may be further disposed on the substrate 1, and the chips 2 may also be disposed on the second surface 1*b* of the substrate 1 to form a double-sided packaging structure, thereby improving the integration of a single packaging structure. In addition to the flip-mounting, the chip 2 may also be disposed on the substrate 1 by upright mounting, or the like. Further, a groove may be formed in the substrate 1, and the chip 2 is embedded in the groove of the substrate 1, which is not limited in the present invention. In a word, the chip 2 and the substrate 1 may be disposed with the known packaging structure of the chip 2 in the prior art.

The heat dissipation plate 3 is a metal cover plate that is bonded to the first surface 1*a* of the substrate, and the heat dissipation plate 3 and the substrate 1 form a cavity in a surrounding manner for holding the chip 2 therein. The thermal interface material 6 is filled between the heat dissipation plate 3 and the chip 2, the heat dissipation plate 3 is connected to the first surface 1*a* of the substrate through a conductive connector 9 and electrically connected to the grounding pin 13, and a connection strength between the conductive connector 9 and the substrate 1 and the heat dissipation plate 3 is greater than a connection strength between the thermal interface material 6 and the chip 2 and the heat dissipation plate 3.

Specifically, the heat dissipation plate 3 includes a top cover plate 31 and a side cover plate 32. The top cover plate 31 is a flat plate with a rectangular plane, and the side cover plate 32 is located on a circumferential side of the top cover plate 31, extends downward along an edge of the top cover plate 31, and is bonded to the substrate 1 through the thermal interface material 6. The heat dissipation plate 3 is integrally formed into a box-shaped structure with a downward opening, and a lower surface of the top cover plate 31, an inner wall surface of the side cover plate 32 and an upper surface of the substrate 1 form a cavity in a surrounding manner for holding the chip 2 therein. The heat dissipation plate 3 having a certain structural strength and the box-shaped structure can help the chip 2 to radiate heat and protect the chip 2. For example, the heat dissipation plate 3 enables the chip 2 to be less affected by harmful operation environments such as mechanical tension, shearing, twisting and vibration, and can prevent the chip 2 from being eroded by impurities such as water vapor and dust.

The heat dissipation plate 3 may be made of a material, for example, copper with excellent thermal conductivity and electrical conductivity. The heat dissipation plate 3 covers the non-functional surface 2*b* of the chip 2 to conduct the heat and help the chip 2 to form a thermal interconnection with the outside, thereby assisting the chip 2 with heat radiation.

In other embodiments of the present invention, the heat dissipation plate 3 may also be of another structure with a longitudinal section in a shape of a trapezoid or the like, as long as the heat dissipation plate 3 and the substrate 1 can form the cavity for holding the chip 2.

The plastic packaging layer 7 covers the chip 2, the substrate 1 and the heat dissipation plate 3, and exposes at least part of a surface region of the heat dissipation plate 3. The metal shielding layer 8 is disposed on a surface of the plastic packaging layer 7 and at least connected to the surface region of the heat dissipation plate 3 exposed by the plastic packaging layer 7, and electrically connected to the grounding pin 13 through the heat dissipation plate 3 and the conductive connector 9.

The main material of the plastic packaging layer 7 may be a high-molecular polymer composite material with a filler such as epoxy resin, polyimide and a dry film, which further includes a functional component such as a curing agent, a filler, an accelerant, a releasing agent and a coupling agent. The plastic packaging layer 7 covers the substrate 1, the chip 2, and the like for protection, and provides physical support for the packaging structure.

The metal shielding layer 8 is a continuous film plating layer for reducing electromagnetic interference subjected by the chip 2 and other optional electronic components. An electromagnetic shielding layer is, for example, a copper, stainless steel or titanium-sputtered sandwiched metal film material capable of reflecting and absorbing electromagnetic waves.

The metal shielding layer 8 is required to be grounded for shielding. In this embodiment, the metal shielding layer 8 is connected to the metal heat dissipation plate 3, and the heat dissipation plate 3 is electrically connected to the grounding pin 13 on the surface of the substrate 1 through the conductive connector 9, such that the metal shielding layer 8 is electrically conducted with the grounding pin 13 through the heat dissipation plate 3 and the conductive connector 9 in sequence. Since a conductive path is formed by the heat dissipation plate 3 and the conductive connector 9, the metal shielding layer 8 does not need a structure in the existing technical solution which requires the metal shielding layer 8 to extend to the second surface 1*b* so as to be connected to the grounding pin 13. Compared with the existing packaging structure, the metal shielding layer 8 will not contaminate the solder ball 12 on the surface of the substrate 1, thereby increasing the product yield of the packaging structure and improving the reliability.

Further, the plastic packaging layer 7 completely exposes an outer surface of the top cover plate, and the metal shielding layer 8 completely covers the plastic packaging layer 7 and the outer surface of the top cover plate 31. Since the metal shielding layer 8 is usually deposited by a method such as sputtering, when the sputtering is not uniform, a fault may occur to the metal shielding layer 8. In the prior art, the metal shielding layer is directly connected to the grounding pin, and the place where they are in contact with each other is a small region, thereby resulting in a failure of grounding conduction of the metal shielding layer when a crack occurs near the small region thereof. In this embodiment, the metal shielding layer 8 is completely connected to the outer surface of the top cover plate 31, and the contact area is much greater than that in the existing technical solution, such that the overall grounding conduction is free from influence even though the crack occurs, thereby further improving the reliability of the packaging structure.

Further, a tail end of the metal shielding layer 8 is disposed outside an edge of the substrate, and the metal shielding layer 8 completely covers the plastic packaging layer 7, and does not extend to the region of the substrate 1, thereby avoiding the contamination of the solder ball 12 and maximizing the electromagnetic shielding efficiency of the metal shielding layer 8.

The thermal interface material 6 is a material coated between the heat dissipation plate 3 and the chip 2, and can reduce thermal contact resistance between the chip 2 and the heat dissipation plate 3. In the packaging structure of the chip 2, an epoxy-based heat-conducting adhesive containing an additive such as silver and copper may be used as the thermal interface material 6, which can reduce the thermal contact resistance and adhesively fix the chip 2 and the heat dissipation plate 3 in structure.

When the packaging structure of the chip 2 is in a cyclic process of reflow soldering and temperature testing, different thermal expansion coefficients among the thermal interface material 6, the chip 2 and the heat dissipation plate 3 may lead to different expansion or contraction degrees among the thermal interface material 6, the chip 2 and the heat dissipation plate 3, thereby leading to the concentration of thermal stress and changing a warpage degree between the chip 2 and the heat dissipation plate 3. In severe cases, delamination or cracking may occur among the chip 2, the thermal interface material 6 and the heat dissipation plate 3, thereby causing a failure of the packaging structure of the chip 2.

In this embodiment, the heat dissipation plate 3 is connected to the first surface 1*a* of the substrate through the conductive connector 9, and the connection strength between the conductive connector 9 and the substrate 1 and the heat dissipation plate 3 is greater than the connection strength between the thermal interface material 6 and the chip 2 and the heat dissipation plate 3. The conductive connector 9 with the high connection strength enables more stable connection between the heat dissipation plate and the substrate, and restrains the warpage and deformation between the heat dissipation plate and the substrate, thereby preventing the warpage and deformation from further extending to a central region of the heat dissipation plate, and reducing the delamination of the thermal interface material between the heat dissipation plate and the chip.

Further, in some embodiments of the present invention, the heat dissipation plate 3 and the chip 2 are also connected by at least one fixed connector 4, the thermal interface material 6 is filled in a region among the heat dissipation plate 3, the chip 2 and the fixed connector 4, and a connection strength between the fixed connector 4 and the chip 2 or the heat dissipation plate 3 is greater than the connection strength between the thermal interface material 6 and the chip 2 or the heat dissipation plate 3.

By disposing the fixed connector 4, the connection strength between the chip 2 and the heat dissipation plate 3 is increased, and the warpage and deformation between the chip 2 and the heat dissipation plate 3 are reduced. Further, the fixed connector 4 which serves as a stress concentration region has a higher structural strength and can bear more deformation forces, thereby reducing the risk of delamination of the thermal interface material 6, and improving the reliability of the packaging structure of the chip 2. In addition, since the conductive connector 9 and the fixed connector 4 increase the connection strength among the heat dissipation plate 3, the substrate 1 and the chip 2 respectively, a heat-radiating adhesive with a high thermal conductivity may be used as the thermal interface material 6 to further improve the heat conduction efficiency between the chip 2 and the heat dissipation plate 3.

Further, the heat dissipation plate 3 and the chip 2 are connected by a plurality of fixed connectors 4, and the fixed connectors 4 are at least distributed at an edge of the non-functional surface 2*b* of the chip 2. By disposing a plurality of fixed connectors 4, the connection strength between the chip 2 and the heat dissipation plate 3 can be further increased, and the stress can be dispersed to the plurality of fixed connectors 4, thereby reducing a risk of connection failure caused by a single fixed connector 4. Generally, since the warpage and deformation are gradually formed from the edge to the center of the non-functional surface 2*b* of the chip 2, the fixed connectors 4 at least disposed at the edge can restrain the warpage and deformation between the chip 2 and the heat dissipation plate 3 better.

Further, the fixed connector 4 at least includes first fixed connectors 41 and second fixed connectors 42. A connection strength between the first fixed connectors 41 and the chip 2 or the heat dissipation plate 3 is greater than a connection strength between the second fixed connectors 42 and the chip 2 or the heat dissipation plate 3. The first fixed connectors 41 are distributed at four corners and/or four sides of the non-functional surface 2*b* of the chip 2, and the second fixed connectors 42 are distributed in a region between the first fixed connectors 41 on two opposite sides. The first fixed connectors 41 with the higher connection strength disposed at four sides and/or four corners can further restrain the warpage and deformation between the chip 2 and the heat dissipation plate 3. The second fixed connectors 42 with the lower connection strength disposed in the central region can reduce production cost to some extent.

The above distribution manner is not limited. In other embodiments of the present invention, the first fixed connectors 41 and the second fixed connectors 42 may be arranged in other manners. In addition to four sides and/or four corners, the first fixed connectors 41 may be additionally disposed in the central region of the chip 2 to enable the stress to be distributed more uniformly.

In this embodiment, the area of a fixed connection region between the first fixed connectors 41 and the chip 2 or the heat dissipation plate 3 is greater than the area of a fixed connection region between the second fixed connectors 42 and the chip 2 or the heat dissipation plate 3. By disposing the fixed connector 4 with a larger contact area, the connection strength can be higher. In other embodiments of the present invention, the first fixed connector 41 and the second fixed connector 42 may also be made of different materials.

Specifically, in this embodiment, the conductive connector 9 and the fixed connector 4 are bonded metal blocks 4*a* disposed between the heat dissipation plate 3 and the substrate 1 and between the heat dissipation plate 3 and the chip 2, respectively. The bonded metal block 4*a* includes base metal layers 4*a*1 bonded to the substrate 1, the chip 2 and the heat dissipation plate 3 respectively, and a bonding layer 4*a*2 located between the base metal layers 4*a*1.

At least one chip-side metal block is disposed on the non-functional surface 2*b* of the chip 2. At least one cover plate-side metal block is disposed on an inner surface of the top cover plate 31, the position and the number of the cover plate-side metal blocks are disposed corresponding to the chip-side metal blocks, and the cover plate-side metal block and the chip-side metal block are bonded to form the bonded metal block 4*a*.

In addition to the high structural strength and the high connection strength among the substrate 1, the chip 2 and the heat dissipation plate 3, the bonded metal block 4*a* formed by fusion bonding also has an excellent thermal conductivity, and can further improve the heat radiation efficiency between the chip 2 and the heat dissipation plate 3.

In summary, in the present invention, since the metal heat dissipation plate is connected to the grounding pin 13 on the first surface of the substrate through the conductive connector 9, the metal shielding layer 8 disposed on the surface of the plastic packaging layer 7 can be directly and electrically conducted with the grounding pin 13 through the heat dissipation plate 3 and the conductive connector 9, such that the metal shielding layer 8 does not need a structure in the existing technical solution which requires the metal shielding layer 8 to extend to the second surface 1*b* so as to be connected to the grounding pin 13. Thus, the metal shielding layer 8 will not contaminate the solder ball 12 on the surface of the substrate 1. Further, the metal shielding layer 8 which is in large-area contact with the top cover plate 31 of the heat dissipation plate is protected from grounding conduction failure arising from a crack, thereby increasing the product yield of the packaging structure and improving the reliability. In addition, the conductive connector 9 and the fixed connector 4 with the connection strengths higher than that of the thermal interface material 6 are disposed among the heat dissipation plate 3, the substrate 1 and the chip 2, thereby increasing the connection strength among the chip 2, the substrate 1 and the heat dissipation plate 3 and reducing the warpage and deformation between the chip 2 and the heat dissipation plate 3.

As shown in FIG. 3, based on the same invention concept, a manufacturing method of a chip packaging structure having a heat dissipation plate is further provided according to the embodiment of the present invention. The manufacturing method thereof includes the following steps.

In S1, as shown in FIG. 4, a chip 2 is provided.

Figure 5:
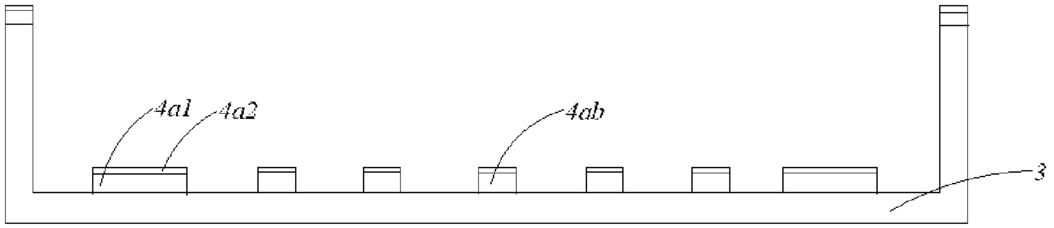

In S2, as shown in FIG. 5, a metal heat dissipation plate 3 is provided, and a metal block is disposed on a surface where a tail end of the heat dissipation plate 3 is in contact with the substrate 1.

Figure 6:
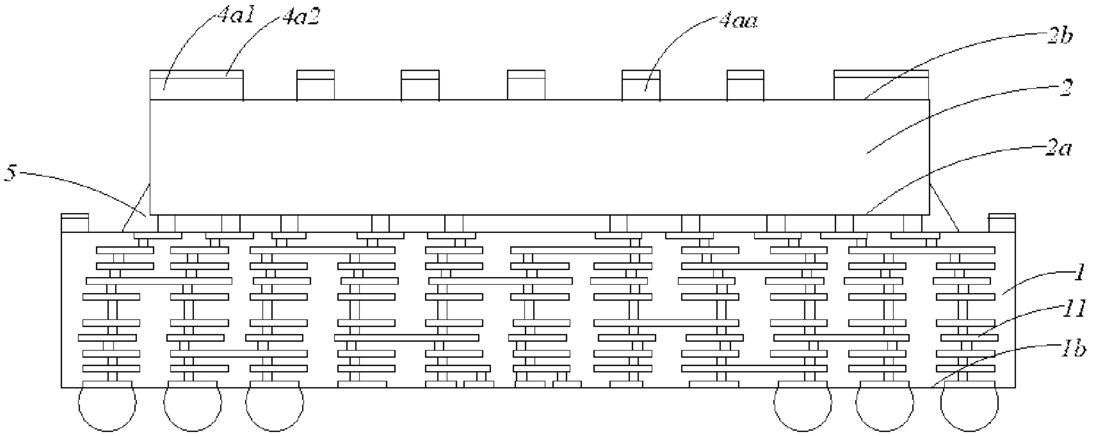

In S3, as shown in FIG. 6, a substrate 1 is provided, a functional surface 2*a* of the chip is disposed towards a first surface 1*a* of the substrate and electrically connected to the first surface 1*a* of the substrate, and a metal block is disposed at a position where the substrate 1 is connected to the heat dissipation plate 3.

Figure 7:
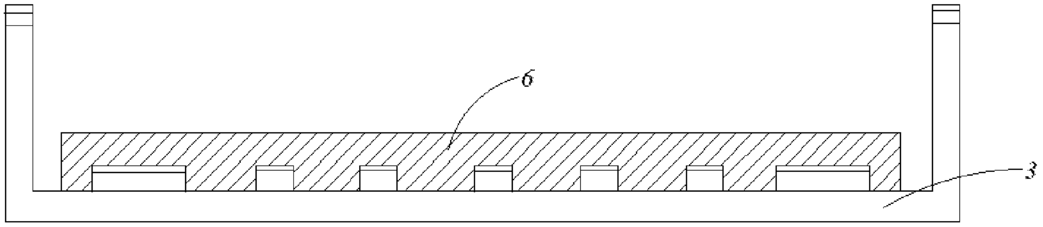

In S4, as shown in FIG. 7, an inner surface of a top cover plate 31 of the heat dissipation plate 3 is coated with a thermal interface material 6.

Figure 8:
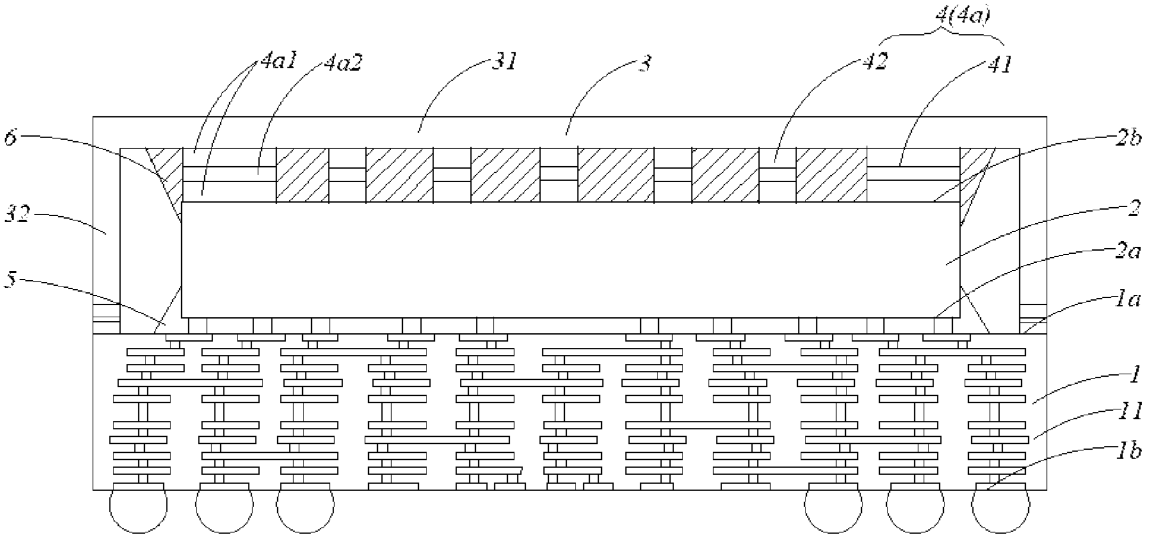

In S5, as shown in FIG. 8, the heat dissipation plate 3 is bonded to the substrate 1, and the metal blocks on the substrate 1 and the heat dissipation plate 3 are fusion-bonded.

Figure 9:
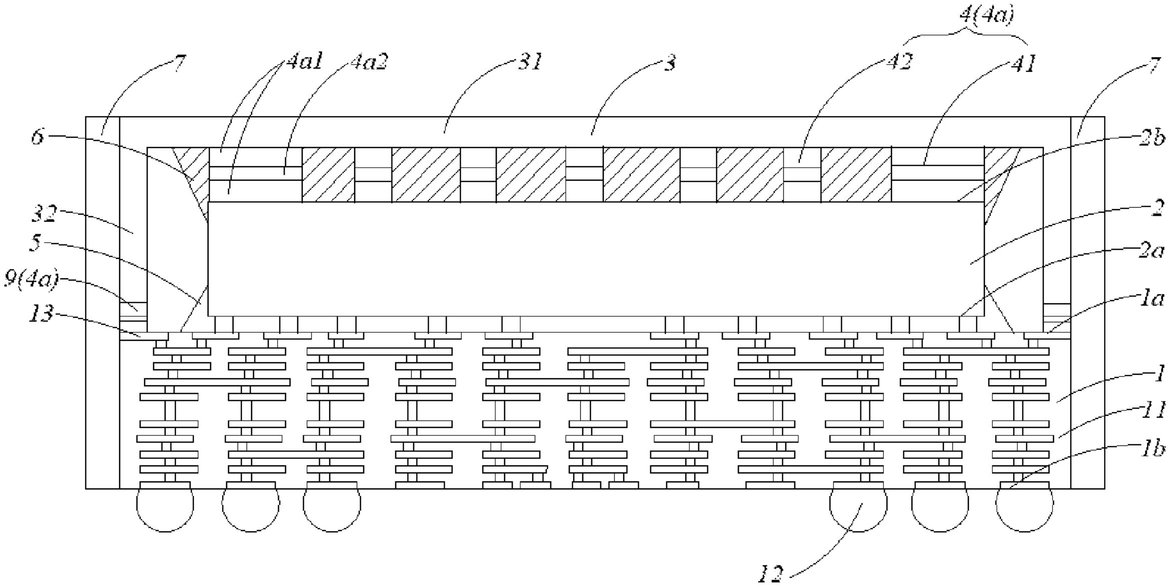

In S6, as shown in FIG. 9, the chip 2, the substrate 1 and the heat dissipation plate 3 are plastic-packaged, and at least pail of a surface of the heat dissipation plate 3 is exposed.

Figure 10:
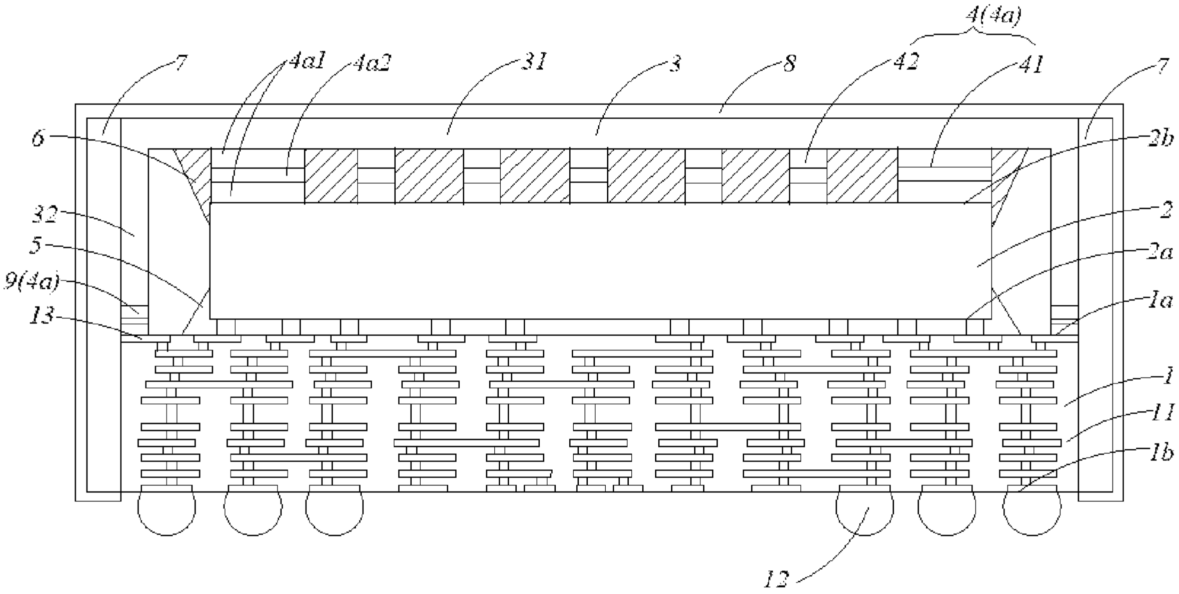

In S7, as shown in FIG. 10, a metal shielding layer 8 is formed by sputtering on a surface of a plastic packaging layer 7.

Step S1 further includes:

disposing at least one chip-side metal block 4*aa* on the non-functional surface 2*b* of the chip 2.

Specifically, first chip-side metal blocks 4*aa* are disposed at four corners and/or four sides of the non-functional surface 2*b* of the chip 2, and second chip-side metal blocks 4*aa* are disposed in a region between the first chip-side metal blocks 4*aa* on two opposite sides, wherein the area of a fixed connection region between the first chip-side metal blocks 4*aa* and the chip 2 is greater than the area of a fixed connection region between the second chip-side metal blocks 4*aa* and the chip 2.

The chip-side metal block 4*aa* includes a base metal layer 4*a*1 and a bonding layer 4*a*2 disposed on the base metal layer 4*a*1.

In some embodiments of the present invention, step S1 further includes:

disposing a passive electronic component on the substrate 1.

Step S2 further includes:

disposing at least one cover plate-side metal block 4*ab* on the inner surface of the top cover plate 31 of the heat dissipation plate 3.

Specifically, the cover plate-side metal blocks 4*ab* with the same number as the chip-side metal blocks 4*aa* are disposed on the inner surface of the top cover plate 31 of the heat dissipation plate 3 and at the position corresponding to the chip-side metal blocks 4*aa*.

The cover plate-side metal block includes a base metal layer 4*a*1 and a bonding layer 4*a*2 disposed on the base metal layer 4*a*1.

Step S3 specifically includes:

flip-mounting the functional surface 2*a* of the chip on the substrate 1 with the functional surface facing the substrate 1.

An underfill 5 is filled between the chip 2 and the substrate 1.

Step S6 specifically includes:

plastic-packaging the chip 2, the substrate 1 and the heat dissipation plate 3, and completely exposing an outer surface of the top cover plate 31 of the heat dissipation plate 3.

It is to be understood that although the present invention is described in terms of embodiments in this Description, each of the embodiments is not intended to contain an independent technical solution. Such description manner of the Description is merely intended for clarity, and those skilled in the art should regard the description as a whole. The technical solutions in various embodiments may also be combined properly to develop other embodiments that can be understood by those skilled in the art.

The series of detailed illustrations listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A chip packaging structure having a heat dissipation plate, comprising:

a substrate, having a first surface and a second surface opposite to each other, wherein the first surface of the substrate is provided with a grounding pin;

at least one chip, disposed on the first surface of the substrate and electrically connected to the substrate;

the heat dissipation plate, wherein the heat dissipation plate is a metal cover plate that is bonded to the first surface of the substrate, the heat dissipation plate and the substrate form a cavity in a surrounding manner for holding the chip therein, a thermal interface material is filled between the heat dissipation plate and the chip, the heat dissipation plate is connected to the first surface of the substrate through a conductive connector and electrically connected to the grounding pin, and a connection strength between the conductive connector and the substrate and the heat dissipation plate is greater than a connection strength between the thermal interface material and the chip and the heat dissipation plate;

a plastic packaging layer, covering the chip, the substrate and the heat dissipation plate, and exposing at least part of a surface region of the heat dissipation plate; and a metal shielding layer, disposed on a surface of the plastic packaging layer and at least connected to the surface region of the heat dissipation plate exposed by the plastic packaging layer, and electrically connected to the grounding pin through the heat dissipation plate and the conductive connector;

wherein the heat dissipation plate and the chip are connected by at least one fixed connector, and a connection strength between the fixed connector and the chip or the heat dissipation plate is greater than the connection strength between the thermal interface material and the chip or the heat dissipation plate;

wherein the heat dissipation plate and the chip are connected by a plurality of fixed connectors, and the fixed connectors are at least distributed at an edge of a non-functional surface of the chip;

wherein the fixed connectors at least comprise first fixed connectors and second fixed connectors, a connection strength between the first fixed connectors and the chip or the heat dissipation plate is greater than a connection strength between the second fixed connectors and the chip or the heat dissipation plate, the first fixed connectors are distributed at four corners and/or four sides of the non-functional surface of the chip, and the second fixed connectors are distributed in a region between the first fixed connectors on two opposite sides.

2. The chip packaging structure having a heat dissipation plate according to claim 1, wherein an area of a fixed connection region between the first fixed connectors and the chip or the heat dissipation plate is larger than an area of a fixed connection region between the second fixed connectors and the chip or the heat dissipation plate.

3. The chip packaging structure having a heat dissipation plate according to claim 1, wherein the fixed connector is a bonded metal block disposed between the chip and the heat dissipation plate, and the conductive connector is a bonded metal block disposed between the substrate and the heat dissipation plate.

4. The chip packaging structure having a heat dissipation plate according to claim 3, wherein the chip has a functional surface towards the first surface of the substrate and a non-functional surface opposite to the functional surface, and at least one chip-side metal block is disposed on the non-functional surface of the chip.

5. The chip packaging structure having a heat dissipation plate according to claim 4, wherein the heat dissipation plate comprises a top cover plate and a side cover plate extending downward along an edge of the top cover plate, the top cover plate is bonded above the non-functional surface of the chip, a tail end of the side cover plate is connected to the first surface of the substrate through the conductive connector, at least one cover plate-side metal block is disposed on an inner surface of the top cover plate, a position and a number of the at least one cover plate-side metal block are set corresponding to those of the at least one chip-side metal block, and the cover plate-side metal block and the chip-side metal block are bonded to form the bonded metal block.

6. The chip packaging structure having a heat dissipation plate according to claim 1, wherein the plastic packaging layer completely exposes an outer surface of the top cover plate of the heat dissipation plate, and the metal shielding layer completely covers the plastic packaging layer and the outer surface of the top cover plate.

7. The chip packaging structure having a heat dissipation plate according to claim 6, wherein a tail end of the metal shielding layer is disposed outside an edge of the substrate.

* * * * *